PROCESS FOR FORMING MONOCRYSTALLINE AND POLY
Filed Nov. 2, 1970
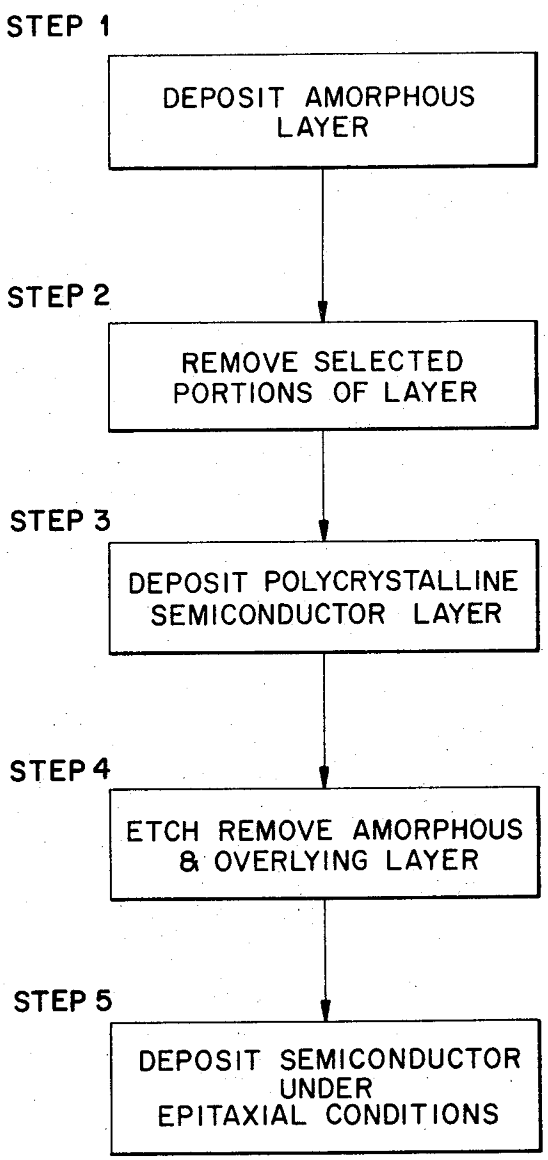
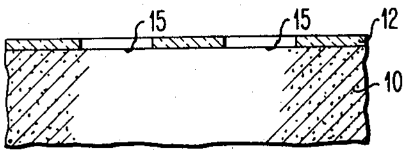
FIG. 1
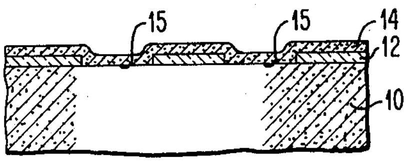
FIG. 2
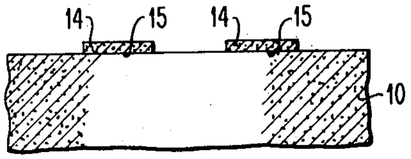
FIG. 3
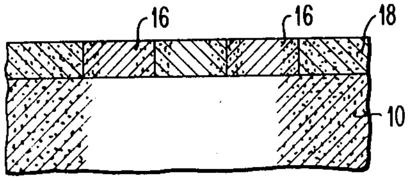
FIG. 4
FIG. 5
INVENTORS
BERNARD M. KEMLAGE
HANS B. POGGE
BY Wolmar J. Stoffel
ATTORNEY United States Patent Office 3,698,947

Patented Oct. 17, 1972

3,698,947

PROCESS FOR FORMING MONOCRYSTALLINE AND POLY

Bernard M. Kemlage, Hopewell Junction, and Hans B. Pogge, La Grangeville, N.Y., assignors to International Business Machines Corporation, Armonk, N.Y.

Filed Nov. 2, 1970, Ser. No. 85,849
Int. Cl. B44d 1/18
U.S. Cl. 117—212 10 Claims

ABSTRACT OF THE DISCLOSURE

A method wherein an amorphous material is initially deposited on a monocrystalline substrate and wherein subsequently selected portions of the amorphous layer are removed to expose portions of the surface of the monocrystalline substrate. A thin layer of a polycrystalline semiconductor material is deposited over the whole wafer. The remaining portions of the amorphous layer are removed including the overlying polycrystalline material. A layer of semiconductor material is deposited on the substrate under epitaxial growth conditions which will form polycrystalline material over the remaining polycrystalline regions and epitaxial material over the exposed monocrystalline regions of the substrate.

BACKGROUND OF THE INVENTION

Field of the invention

This invention relates to the fabrication of semiconductor devices, and more particularly to integrated circuit components. More particularly the invention relates to a method of simultaneously depositing in preselected areas epitaxial and polycrystalline semiconductor material.

Background of the invention

A large majority of modern semiconductor devices have a base of monocrystalline semiconductor material with an overlying epitaxial layer in which are contained active and passive devices. The devices are connected into circuits by a metallurgy system overlying a dielectric layer of material on the surface of the epitaxial layer. The metallurgy makes contact to the various devices through openings in the dielectric layer. The epitaxial layer is a semiconductor material whose crystallographic orientation is normally similar to the crystalline structure of the base wafer. Conventionally the epitaxial layer is formed by heating the crystalline substrates to a high temperature below the melting point of the semiconductor material and bringing them into contact with a gaseous reaction mixture containing a compound of a semiconductor material and a carrier gas, typically hydrogen.

Frequently it is desirable or essential to a particular device fabrication technique that the deposited layer contain selected regions of epitaxial and polycrystalline material. The reasons for including polycrystalline regions are varied; for example, such a region could be used as an insulation barrier or a conduit to carry impurities to selected regions of the device. Impurities diffuse through polycrystalline materials at significantly faster rates than through monocrystalline materials.

Techniques are known to simultaneously grow monocrystalline and polycrystalline regions on a monocrystalline base from a gaseous phase. One such technique is to form an amorphous layer of $SiO_2$ on the surface of a monocrystalline wafer, etch away portions of the layer, and deposit semiconductor material by conventional epitaxial techniques. Monocrystalline material will form over the exposed portion of the wafter and polycrystalline regions over the previously deposited $SiO_2$ layer. However, this technique leaves an $SiO_2$ layer between the polycrystalline layer and base which may be objectionable. Further, the layer may be somewhat uneven due to different growth rates due to the nucleation phenomenon on $SiO_2$ and Si. Adhesion may also be a problem. Another technique, as described in U.S. 3,475,661 is to form surface discontinuities on the surface of the base, as by scribing, and then deposit semiconductor material by conventional epitaxial techniques. Polycrystalline growth will occur over the surface discontinuities. This technique has limitations since the formation of the surface discontinuities by scribing is not well adapted for fabricating micro miniaturized devices. Further, the resultant polycrystalline regions may be discontinuous. Still further the control over the polycrystalline material size will be difficult. Another technique is to selectively heat portions of the device during epitaxial deposition. This also has great limitations since the regions cannot be precisely located.

SUMMARY OF THE INVENTION

An object of this invention is to provide a method for forming a layer of semiconductor material from a gaseous phase which layer contains both polycrystalline regions and monocrystalline regions.

Another object of this invention is to provide an improved technique for precisely producing selected regions of polycrystalline material in an epitaxial film during growth.

Another object is to produce monocrystalline and polycrystalline regions on a monocrystalline substrate without the use of an intermediate amorphous layer.

Another object is to allow control over the crystalline size of the polycrystalline material.

In this method of simultaneously growing polycrystalline and monocrystalline regions of semiconductor material, a layer of amorphous material is formed on the surface of a monocrystalline substrate, selected portion of the layer removed, a thin layer of polycrystalline semiconductor material deposited on the substrate over both the exposed portions of the substrate and the amorphous layer. Then the substrate is subjected to an etchant for the removal of the amorphous material thereby also removing any overlying layer of polycrystalline semiconductor material, but not the polycrystalline material deposition on the monocrystalline areas. Subsequently a layer of semiconductor material is deposited from the gaseous phase under conditions which form polycrystalline regions over the polycrystalline layer and monocrystalline regions over the exposed surface of the substrate.

BRIEF DESCRIPTION OF THE DRAWINGS

The foregoing and other objects, features, and advantages of the invention will become more apparent from the more particular description of the preferred embodiment as illustrated in the accompanying drawings.

In the drawings

FIGS. 1 through 4 are a sequence of elevational cross-sectional views of a semiconductor which illustrates the structure during various stages of the method of the invention.

FIG. 5 is a block diagram setting forth the various steps of the subject process.

DESCRIPTIONS OF PREFERRED EMBODIMENTS

This method of forming a layer of semiconductor material on a monocrystalline wafer having selected monocrystalline regions and polycrystalline regions can be used in fabricating any suitable type semiconductor material as for example, silicon, germanium, and III–V compounds. Referring now to FIG. 1 of the drawings, a layer of amorphous material 12 is deposited or grown on a monocrystalline semiconductor wafer 10. The amorphous layer can be of any suitable type material as for example $SiO_2$, $Al_2O_3$, $Si_3N_4$, or the like, deposited by any suitable technique as for example pyrolytic deposition, sputter deposition, or in the case of $SiO_2$ by thermal growth. The specific techniques suitable for depositing an amorphous layer on a semiconductor wafer are well known in the art and do not comprise any part of the invention. The thickness of the layer 12 can be any suitable thickness, preferably in the range of 500 A. to 10,000 A. depending on the type of material. When using an $SiO_2$ layer, the thickness is preferably on the order of 2000 angstroms. When using a $Si_3N_4$ layer the thickness can be considerably less. Selected portions are removed from wafer 12 exposing surface portions 15 of layer 10 and leaving the remaining layer portions over the areas where monocrystalline regions will subsequently be grown in the semiconductor layer. The portions of layer 12 can be removed by any suitable technique as for example, photolithographic techniques, where a photoresist is deposited on the surface exposed and cured. The exposed portions of the layer 12 can then be removed by etching. Alternately layer 12 can be shaped by sputter etching, or alternately the layer can be deposited in the original configuration through a mask. The deposition of the amorphous layer and fabrication thereof are shown in steps 1 and 2 of FIG. 5.

As shown in FIG. 2 a thin layer 14 of polycrystalline semiconductor material is then deposited on the surface of wafer 10 in contact with the exposed surfaces 15 of wafer 10 and over the layer 12. In general, the thickness of layer 14 is sufficient to assure at least total surface coverage over the monocrystalline areas. A thickness greater than 100 A. normally provides sufficient coverage. More preferably layer 14 has a thickness in the range of 500 to 1000 A. The upper limit for the thickness of layer 14 is determined by the ease of removal in the subsequent step. Layer 14 is deposited by any technique which results in a polycrystalline structure over surface 15. This can thus be achieved by depositing at a lower temperature than is normally required for formation of an epitaxial layer on a monocrystalline structure. For example, when depositing silicon at atmospheric pressure the wafer can be heated to a temperature on the order of 700° C. The deposition is accomplished in the conventional epitaxial reactor where a compound of the semiconductor material in combination with a carrier gas is introduced into the reactor containing wafers suitably heated to the desired temperature. In the fabrication of a silicon polycrystalline layer the temperature can be somewhat reduced if the pressure is reduced. In the deposition of silicon typical compounds of a semiconductor material are $SiH_4$, $SiCl_4$, $SiHCl_3$, or the like. The deposition of layer 14 is shown in step 3 of FIG. 5.

Layer 12 and the overlying portions of layer 14 of polycrystalline material are removed as shown in FIG. 3 leaving only portions of layer 14 which were deposited directly on surface 15 of wafer 10. This removal is accomplished conveniently by subjecting the wafer structure shown in FIG. 2 to a standard etchant for the amorphous material of layer 12. Relatively thin layers of polycrystalline layer 14 are sufficiently porous to permit chemical etchant attack of the underlying layer 12. When amorphous layer 12 is $SiO_2$, a standard HF solution can be utilized. Such a solution consists of 49% HF (molar percent) in $H_2O$. Preferably the wafer in the solution is subjected to ultrasonic vibration in order to enhance the polycrystalline layer removal from the substrate surface. The removal of layer 12 and overlying portions of 14 is shown in step 4 of FIG. 5.

As shown in FIG. 4 semiconductor material is then deposited on the surface of wafer 10 under conditions which will produce an epitaxial deposition on a monocrystalline base. The remaining portions of layer 14 prevent the formation of monocrystalline semiconductor material. Over the regions where the surface of monocrystalline wafers 10 is exposed monocrystalline semiconductor regions are formed. In the deposition of semiconductor material the same basic mixture used in step 3 to deposit polycrystalline semiconductor material may be used with the exception that the wafers in step 5 are heated to a higher temperature. When depositing silicon, a temperature in the range of 900 to 1300° C. is preferred. When depositing germanium a somewhat lower temperature can be utilized. The layer of semiconductor material deposited in step 5 can be any suitable thickness, typically it is from one to three microns in thickness depending on the ultimate type of device or structure required.

Due to Si nucleation phenomenons on $SiO_2$, it is difficult to deposit equal thickness of polycrystalline Si over variable areas of $SiO_2$. With the method of the subject invention, it is possible to form polycrystalline areas of equal thickness in any desired size pattern.

The following example is included to depict a preferred specific embodiment of the method and should not be construed to unduly lmit same.

EXAMPLE

A silicon wafer with an etched oxide pattern, exposing a particular pattern of the surface of the wafer, was placed into a standard open tube epitaxial reactor. The wafer was heated on a R.F. inductively heated graphite susceptor to 700° C. in an $H_2$ atmosphere. After the temperature was reached, a mixture of Silane and $H_2$ in the volume ratio of $5\times10^{-4}$ was introduced to form a 500 A. layer of polycrystal material over both the exposed wafer surface and the overlying oxide. The growth time was approximately 5 minutes. The growth was terminated, the reaction system cooled, and the wafer removed. The wafer was placed in an HF etch and subjected to ultrasonic agitation to remove the oxide and the overlying loosely bonded polycrystalline material. This etching operation did not affect the polycrystalline layer in direct contact with the wafer. The wafer was then placed back in the reactor and heated to a growth temperature of 1100° C. in a $H_2$ atmosphere. The same Silane $H_2$ mixture, described previously, was admitted to the reactor for 5 minutes. A monocrystalline Si layer was formed on the newly exposed wafer surface, and simultaneously a polycrystalline growth occurred over the previously deposited polycrystalline regions. The reaction system was allowed to cool down, and the wafer removed. Inspection of the wafer indicated that the layer thickness of both monocrystalline and polycrystalline regions were the same, i.e. approximately 2 microns.

While the invention has been particularly shown and described with reference to preferred embodiments, it will be understood by those skilled in the art that the foregoing and other changes in the form and details may be made therein without departing from the spirit and scope of the invention.

What is claimed is:

1. A method of growing on a monocrystalline semiconductor substrate a layer of semiconductor material selected from the group consisting of silicon, germanium, and III–V compounds, having regions of polycrystalline structure directly in contact with the monocrystalline substrate comprising;

forming a layer of amorphous material on a surface of the monocrystalline substrate, removing selected portions of the layer of amorphous material thereby exposing portions of the surface of said substrate, depositing a layer of polycrystalline semiconductor material on said substrate over the remaining portions of the amorphous material and on the exposed surface of the substrate, subjecting the substrate to an etchant for said amorphous material thereby removing the remaining portions of said amorphous layer and the overlying layer of polycrystalline semiconductor material, epitaxially depositing a layer of semiconductor material on said substrate thereby forming polycrystalline material over the remaining polycrystalline material and monocrystalline semiconductor material over the exposed surface of the substrate.

2. The method of claim 1 wherein said layer of amorphous material is a material selected from the group of $SiO_2$, $Si_3N_4$, and $Al_2O_3$.

3. The method of claim 1 wherein said layer of amorphous material is $SiO_2$ having a thickness on the order of 2000 A.

4. The method of claim 1 wherein said layer of polycrystalline semiconductor material has a thickness greater than 100 A.

5. The method of claim 1 wherein said polycrystalline semiconductor material is Si which is deposited by contacting the substrate with a gaseous mixture which include $SiH_4$ and a carrier gas.

6. The method of claim 5 wherein the substrate is maintained at a relatively low temperature on the order of 700° C. during deposition of the polycrystalline Si material, said layer having a thickness in the range of 500 to 1000 A.

7. The method of claim 3 wherein the $SiO_2$ layer and overlying semiconductor layer are removed by subjecting the substrate to an etchant comprising an aqueous HF solution.

8. The method of claim 1 wherein the substrate during contact with an etchant for amorphous material is subject to ultrasonic vibration.

9. The method of claim 1 wherein the layer of semiconductor material epitaxially deposited is Si, and the substrate is Si.

10. The method of claim 9 wherein the layer of Si is epitaxially deposited by contacting the Si substrate heated to a temperature in the range of 900 to 1300° C. with a gaseous reaction mixture which includes a compound of Si and a carrier gas.

References Cited

UNITED STATES PATENTS

| | | | |
|---|---|---|---|
| 3,326,729 | 6/1967 | Sigler | 96—36.2 X |
| 3,189,973 | 1/1965 | Edwards et al. | 148—174 |

ALFRED L. LEAVITT, Primary Examiner

D. A. SIMMONS, Assistant Examiner

U.S. Cl. X.R.

117—201, 215; 148—174; 156—17